United States Patent
Chen

(10) Patent No.: US 6,962,854 B2
(45) Date of Patent: Nov. 8, 2005

(54) MARKS AND METHOD FOR MULTI-LAYER ALIGNMENT

(75) Inventor: Feng-Yi Chen, Taichung (TW)

(73) Assignee: Nanya Technology Corporation, Taoyuan (TW)

( * ) Notice: Subject to any disclaimer, the term of this patent is extended or adjusted under 35 U.S.C. 154(b) by 46 days.

(21) Appl. No.: 10/684,108

(22) Filed: Oct. 10, 2003

(65) Prior Publication Data

US 2004/0092080 A1  May 13, 2004

(30) Foreign Application Priority Data

Nov. 8, 2002 (TW) .............................. 91132929 A

(51) Int. Cl.⁷ ............................................. H01L 21/76
(52) U.S. Cl. ..................... 438/401; 438/462
(58) Field of Search .................. 257/48, 797; 438/401, 438/462

(56) References Cited

U.S. PATENT DOCUMENTS

| | | | | |
|---|---|---|---|---|
| 4,238,685 A | * | 12/1980 | Tischer | 378/34 |
| 4,423,127 A | * | 12/1983 | Fujimura | 430/22 |
| 6,072,192 A | * | 6/2000 | Fulford et al. | 257/48 |
| 6,118,137 A | * | 9/2000 | Fulford et al. | 257/48 |
| 6,228,743 B1 | * | 5/2001 | Chen et al. | 438/401 |
| 6,465,322 B2 | * | 10/2002 | Ziger et al. | 438/401 |
| 6,562,710 B2 | * | 5/2003 | Nakagawa et al. | 438/619 |
| 6,732,004 B2 | * | 5/2004 | Mos et al. | 700/114 |
| 6,782,525 B2 | * | 8/2004 | Garza et al. | 716/19 |
| 2002/0102811 A1 | * | 8/2002 | Farrow et al. | 438/401 |
| 2003/0174879 A1 | * | 9/2003 | Chen | 382/151 |

* cited by examiner

Primary Examiner—Asok Kumar Sarkar
(74) Attorney, Agent, or Firm—Quintero Law Office

(57) ABSTRACT

Marks and a method for multi-layer alignment. A first layer with first alignment marks is formed on a semiconductor substrate, wherein the first alignment marks are separated parallelly by a predetermined distance. A second layer with second alignment marks is formed on the first layer, wherein the second alignment marks are separated parallelly by a predetermined distance. The shift distance of each first alignment mark is measured to calculate a first midpoint between the first alignments. The shift distance of each second alignment mark is measured to calculate a second midpoint between the second alignments. A third midpoint acting as a datum point between the fist midpoint and the second midpoint is calculated.

4 Claims, 10 Drawing Sheets

MARKS AND METHOD FOR MULTI-LAYER ALIGNMENT

BACKGROUND OF THE INVENTION

1. Field of the Invention

The invention relates to an alignment mark and alignment method using the same, and more particularly to marks and method for multi-layer alignment.

2. Description of the Related Art

Electronic elements, such as MOS or capacitors, are fabricated using integrated circuit fabrication comprising deposition, photolithography, etching, diffusion, and ion implantation.

In general photolithography, a photoresist layer is coated on a wafer, and the wafer is exposed in an exposure system, and then developed to transfer the pattern from the mask to the photoresist layer. Photolithography may be repeated several times to overlay multi-layer interconnect structures.

In the overlay step, inaccuracy of alignment must be controlled within an allowable range. For example, each exclusive mask used on a corresponding layer forms a predetermined pattern, in which a target formed in each mask enables alignment of a current layer with a previous layer.

Overlay error occurs easily during alignment and exposure because the mask on the wafer in the exposure system is not stable or temperature is not controlled.

FIGS. 1a to 1c are cross-sections of the conventional method for multi-layer alignment.

In FIG. 1a, a semiconductor substrate, such as wafer 10, is provided. A metal layer is formed on a chip of the wafer 10. A photoresist layer is formed on the metal layer. A first mask 11 having a pattern is exposed to form the pattern on the photoresist layer by a light source, and the photoresist layer is developed to form a pattern on the photoresist layer. The metal layer is etched to form a first metal wire layer 11a using the photoresist layer as a mask. The photoresist layer is removed. The first metal wire layer 11a matches the pattern of the first mask layer 11, wherein a pair of first marks 111 and 112 in the first metal wire layer 11a correspond to first marks 101 and 102 in the first mask layer 11.

FIG. 1b is a top view of multiple layers formed by the first mask, wherein the layers are the metal wire layers 11a. In FIG. 1b. first marks 101 and 102 are formed on the X and Y axes of the first mask layer 11 respectively. The first marks 101 and 102 align exactly with the alignment mark of the wafer to form the corresponding first marks 111 and 112 of the metal wire layer 11a.

FIG. 1c is a cross section of the wafer with multiple layers formed by the first mask 11 where photolithography is performed.

FIG. 1d is a top view of the multiple layers formed by the second mask, comprising metal wire layers 11a. FIG. 1e is a top view of the pattern formed by the second mask on the pattern formed by the first mask. FIG. 1f is a cross section of the wafer with multiple layers formed by the second mask where photolithography is performed.

In FIG. 1d, the second mask is exposed after the first mask 11. Second marks 121 and 122 are formed on the X and Y axes of the second mask 12 respectively. The second marks 121 and 122 enable a second metal wire layer 12a to correspondingly form on the first metal wire layer 11a.

After photolithography, the wafer is deformed by high temperature in oxidation or thermal process, and the alignment marks of the metal wire layer are also deformed. In FIG. 1g, the position of the first metal wire layer 11a varies from the second metal wire layer 12a because of the difference in the direction of deformation between the first metal wire layer 11a and the second metal wire layer 12a.

In FIG. 1h, the third metal wire layer 13a is formed on the second metal wire layer 12a and corresponds to the first metal wire layer 11a. The third mask, forming the third metal wire layer 13a, cannot align with the first metal wire layer 11a with the second metal wire layer 12a because the position of the alignment mark has changed.

In FIG. 1i, the third metal wire layer 13a is formed on the second metal wire layer 12a and corresponds to the second metal wire layer 12a but not the first wire layer 11a. The pattern is not transferred well if layers are not aligned precisely before exposure of the photoresist layer, making the chip unusable.

In ULSI fabrication, electronic element size is reduced during various steps, such that the quality of resolution and overlay accuracy of the conventional exposure process is sufficient.

SUMMARY OF THE INVENTION

The present invention is directed to marks and a method for multi-layer alignment. The marks align easily in the pattern process, such that alignment errors are reduced.

Accordingly, the present invention provides a method for multi-layer alignment of a semiconductor substrate with alignment marks. A first layer with first alignment marks is formed on the semiconductor substrate, wherein the first alignment marks are separated parallelly by a predetermined distance. A second layer with second alignment marks is formed on the first layer, wherein the second alignment marks are separated parallelly by a predetermined distance. The shift distance of each first alignment mark is measured to calculate a first midpoint between the first alignments. The shift distance of each second alignment mark is measured to calculate a second midpoint between the second alignments. A third midpoint acting as a datum point between the fist midpoint and the second midpoint is calculated.

Accordingly, the present invention also provides a method for multi-layer alignment for a semiconductor substrate with alignment marks. A first layer with first alignment marks is formed on the semiconductor substrate, wherein the first alignment marks are separated parallelly by a predetermined distance. A second layer with second alignment marks is formed on the first layer, wherein the second alignment marks are separated parallelly by a predetermined distance, and the second alignment marks and the first alignment marks are alternately disposed. The shift distance of each first alignment mark is measured to calculate a first midpoint between the first alignments. The shift distance of each second alignment mark is measured to calculate a second midpoint between the second alignments. A third midpoint acting as a datum point between the fist midpoint and the second midpoint is calculated.

Accordingly, the present invention provides marks for multi-layer alignment of a semiconductor substrate, comprising a first layer with first alignment marks, wherein the first alignment marks are separated parallelly by a predetermined distance, and a second layer with second alignment marks, wherein the second alignment marks are separated parallelly by a predetermined distance, the second alignment marks and the first alignment marks are alternately disposed and overlap completely.

BRIEF DESCRIPTION OF THE DRAWINGS

For a better understanding of the present invention, reference is made to a detailed description to be read in conjunction with the accompanying drawings, in which.

DETAILED DESCRIPTION OF THE INVENTION

FIGS. 2a to 2h are cross-sections of a method for multi-layer alignment of the present invention.

Figure 3:
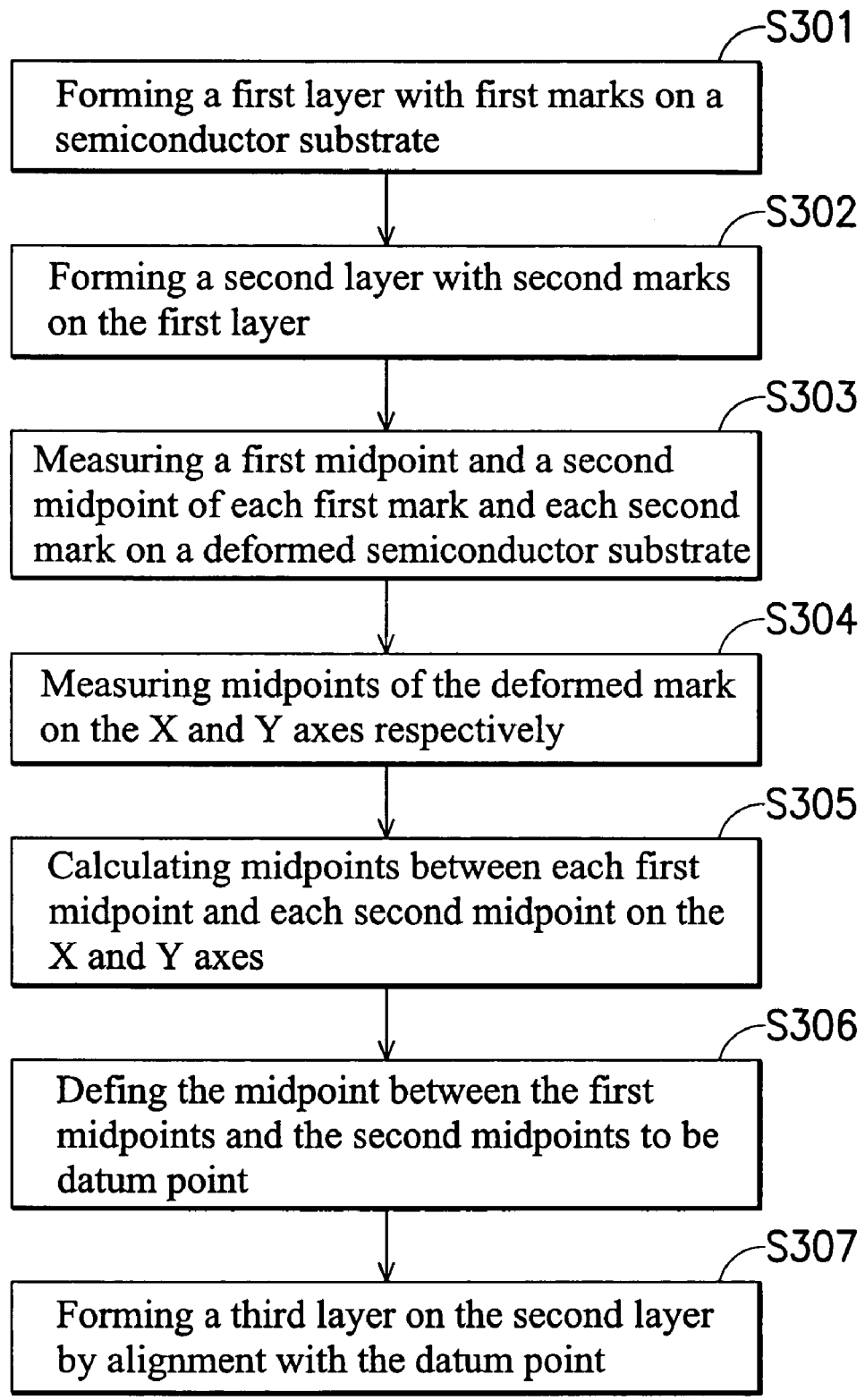
FIG. 3 is a flowchart of a method for multi-layer alignment of the present invention.

FIG. 3 is a flowchart of a method for multi-layer alignment of the present invention.

Figure 4:
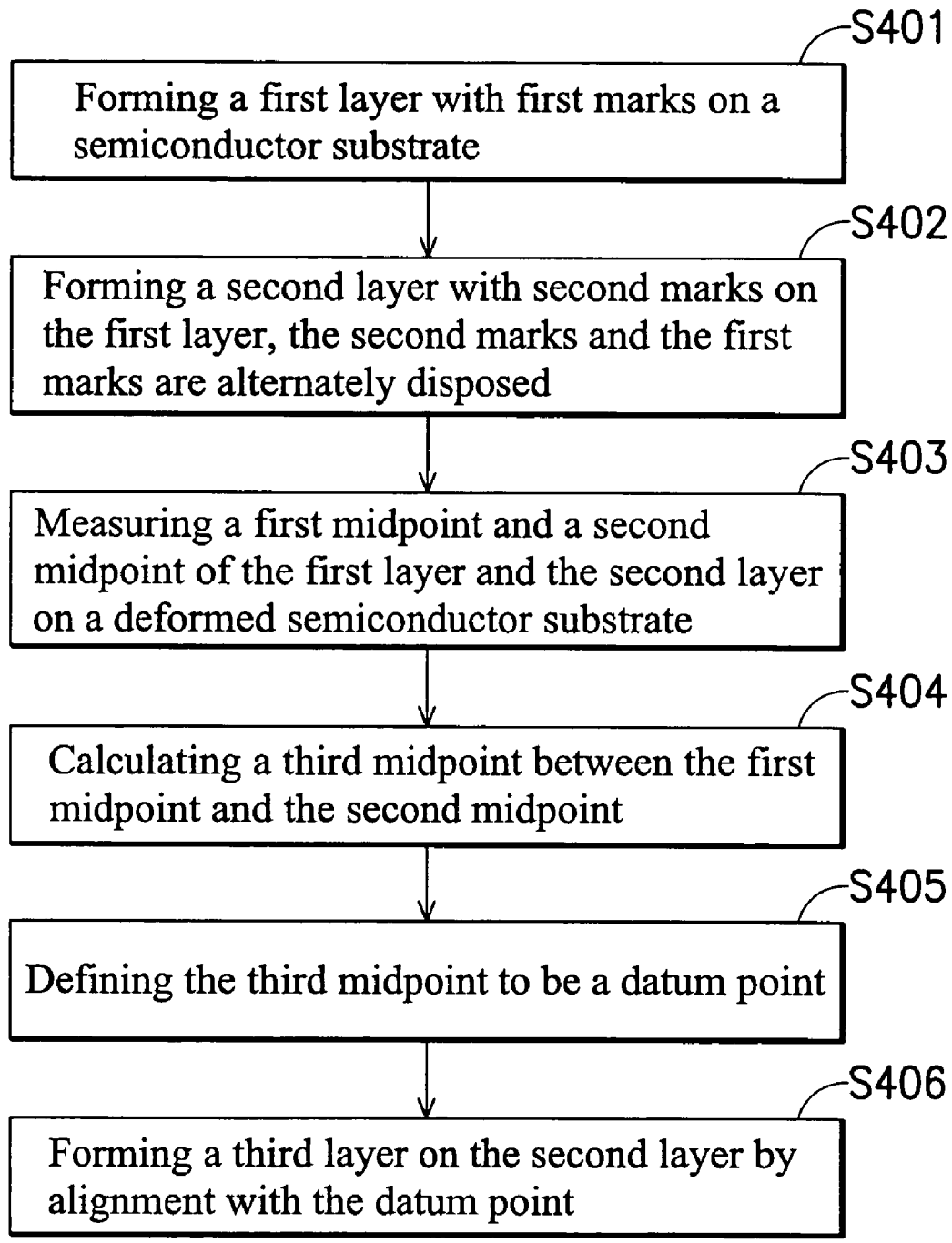
FIG. 4 is a flowchart of another method for multi-layer alignment of the present invention.

FIG. 4 is a flowchart of another method for multi-layer alignment of the present invention.

Figure 2A:
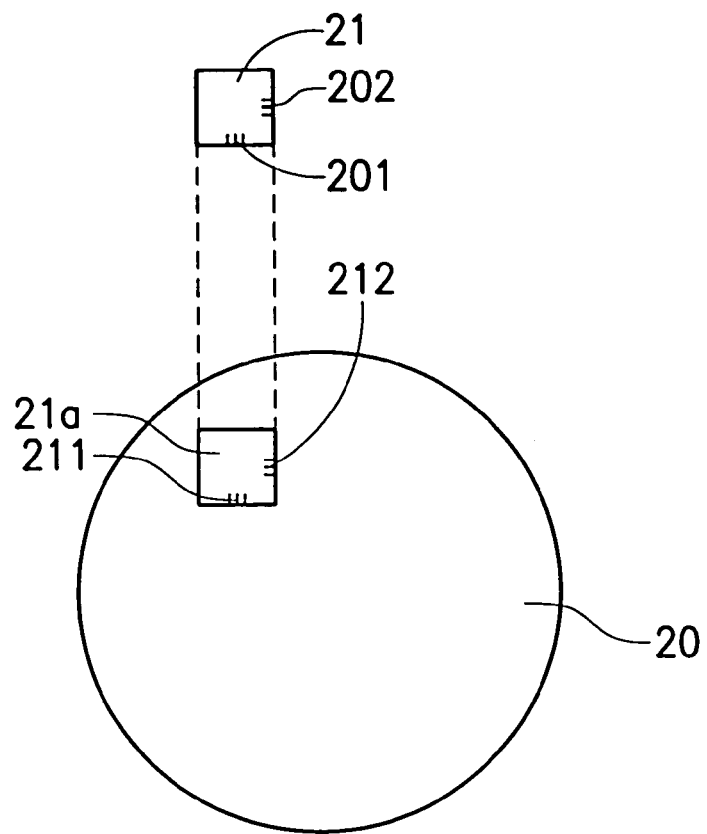
FIGS. 2a to 2h are cross-sections of a method for multi-layer alignment of the present invention.

In FIG. 2a, a semiconductor substrate, such as wafer 20, is provided. A metal layer is formed on a chip of the wafer 20. A photoresist layer is formed on the metal layer. A first mask 21 with a pattern is exposed to form the pattern on the photoresist layer by a light source, and the photoresist is developed to form a pattern on the photoresist layer. The metal layer is etched using the photoresist layer as an etching mask to form a first metal wire layer 21a. The photoresist layer is removed. The first metal wire layer 21a matches the pattern of the first mask layer 21, wherein first marks 211 and 212 in the first metal wire layer 21a correspond to first marks 201 and 202 in the first mask layer 21.

Figure 2B:
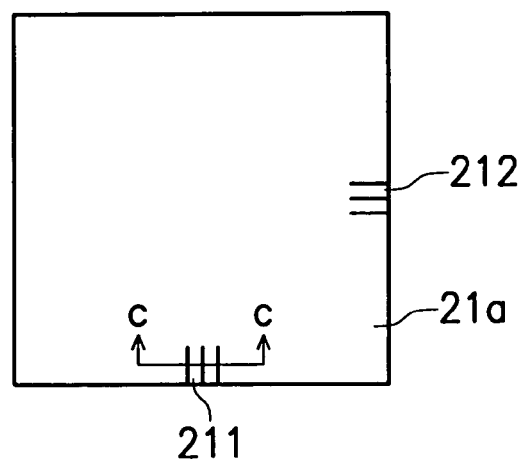
Figure 2C:
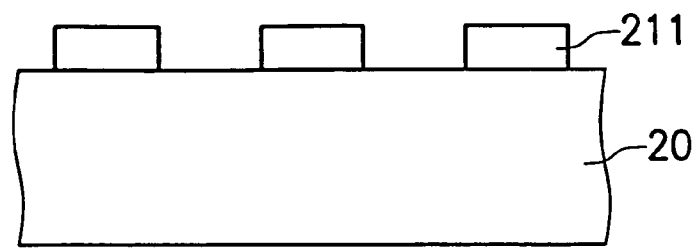

FIG. 2b is a top view of multiple layers formed by the first mask, wherein the layers are the metal wire layers 21a. FIG. 2c is a C—C cross section of FIG. 2b. In FIG. 2b, first marks 201 and 202 are formed on the X and Y axes of the first mask 21 respectively. The first marks 201 and 202 align exactly with the alignment mark of the wafer to form the corresponding first marks 211 and 212 of the metal wire layer 21a.

Figure 2D:
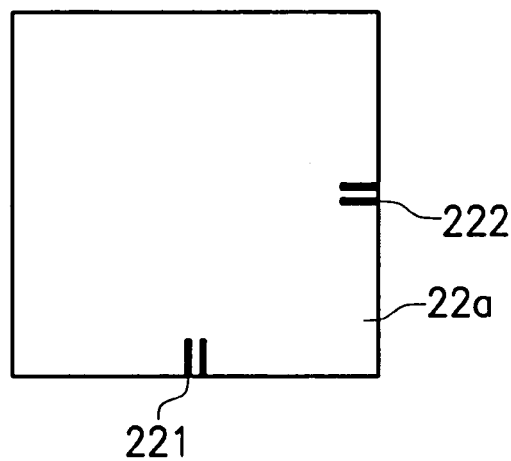
Figure 2E:
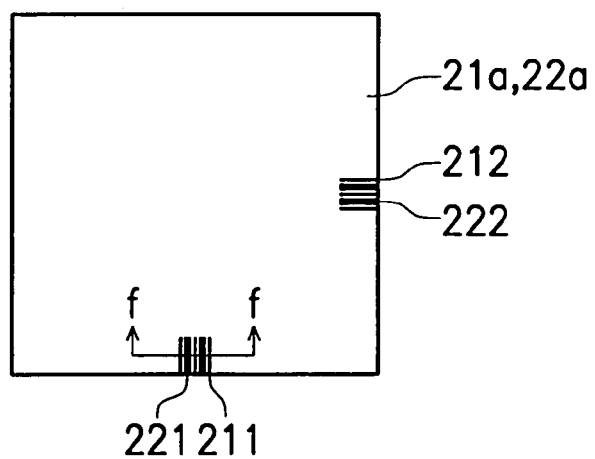
Figure 2F:
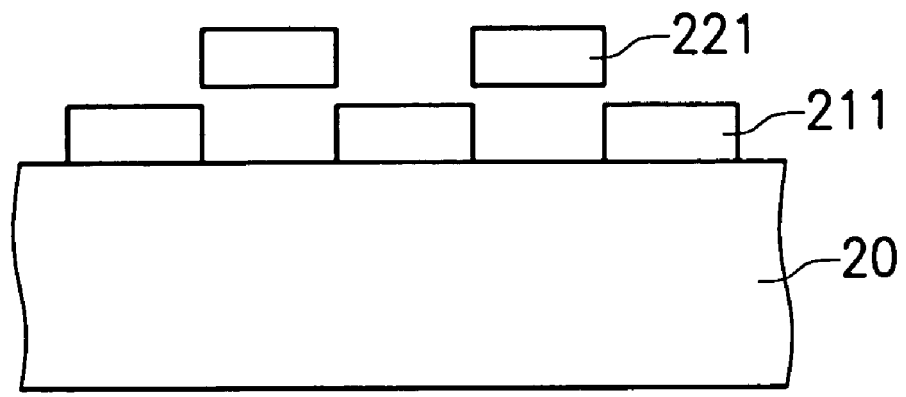

FIG. 2d is a top view of the multiple layers formed by the second mask, comprising metal wire layers 21a, FIG. 2e is a top view of the pattern formed by the second mask on the pattern formed by the first mask. FIG. 2f is an f—f cross section of FIG. 2e.

In FIG. 2d, the second mask with two second marks on the X and Y axes is exposed separately after the first mask 21. A second metal wire layer 22a is formed on the first metal wire layer 21a. The second marks 221 and 222 are formed on the second metal wire layer 22a corresponding to the second marks. The first metal wire layer 21a and second metal wire layer 22a are sequentially formed on the wafer 20. The alignment marks 211, 212, 221 and 222 are separated parallelly by a predetermined distance respectively, and the alignment marks 221,222 and the alignment marks 211, 212 may overlap completely, partially, or not at all.

After photolithography, the wafer is deformed by high temperature in oxidation or thermal process, and the alignment marks of the metal wire layer are also deformed.

Figure 2G:
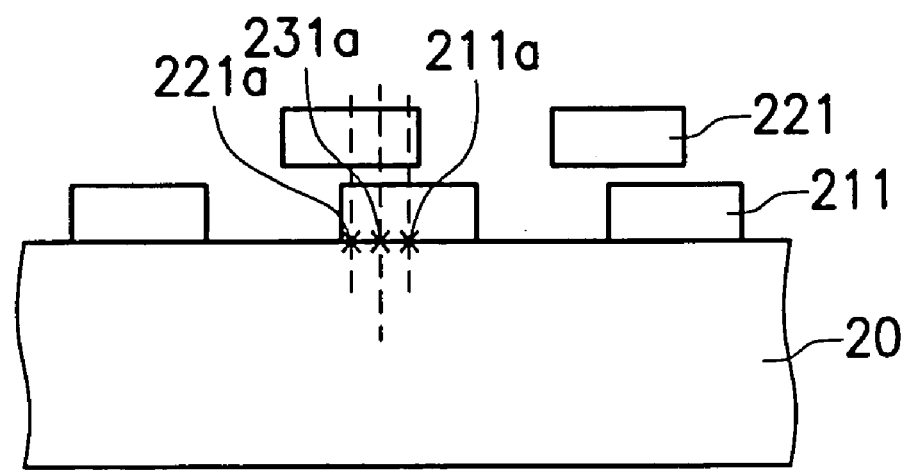

FIG. 2g is a cross-section of the wafer which is deformed.

In FIG. 2g, the position of the first metal wire layer 21a varies from the second metal wire layer 22a because of the difference in the direction of deformation between the first metal wire layer 21a and the second metal wire layer 22a.

A third mask cannot align with either the first metal wire layer 21a or the second metal wire layer 22a because the position of the alignment mark is changed. In the present invention, midpoints 211a and 221a of the first mark 211 and the second mark 221 are measured, and a midpoint 231a between the points 211a and 221a is calculated as shown in FIG. 2g.

Figure 2H:
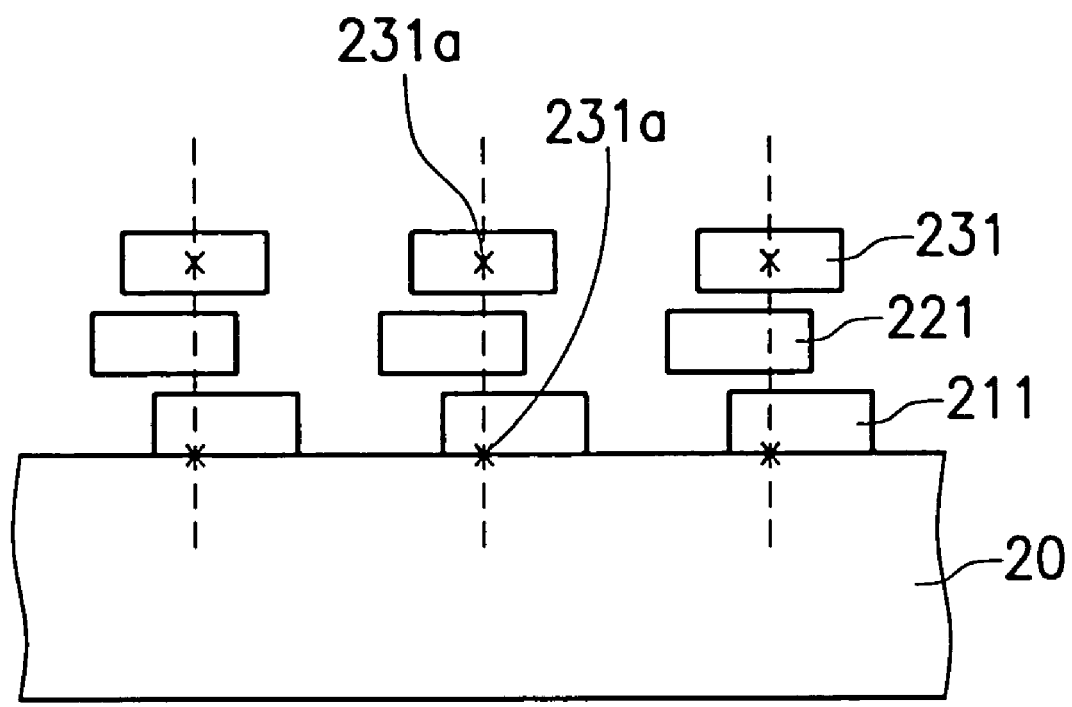

In FIG. 2h, a third metal wire layer is formed exactly on the second metal wire layer, aligned by the midpoint 231a.

FIG. 4 is a flowchart of another method for multi-layer alignment of the present invention.

In step S401, a semiconductor substrate, such as wafer, is provided. A first layer, such as metal wire layer, with first marks is formed on the semiconductor substrate by photolithography. The first marks are separated parallelly by a predetermined distance.

In step S402, a second layer, such as metal wire layer, with second marks is formed on the first layer by photolithography. The second marks are separated parallelly by a predetermined distance, and the second marks and the first marks are alternately disposed.

In step S403, a first midpoint and a second midpoint of the first marks and the second marks on a semiconductor substrate deformed by oxidation or thermal process is measured respectively.

In step S404, a third midpoint between the first midpoint and the second midpoint is calculated.

In step S405, the third midpoint is defined as a datum point.

In step S406, a third layer is formed on the second layer by alignment with the datum point, such that the third layer aligns with both the first layer and the second layer.

A method for alignment of the present invention can be used in a conventional metal wire layer as shown in FIG. 3.

Figure 1A:
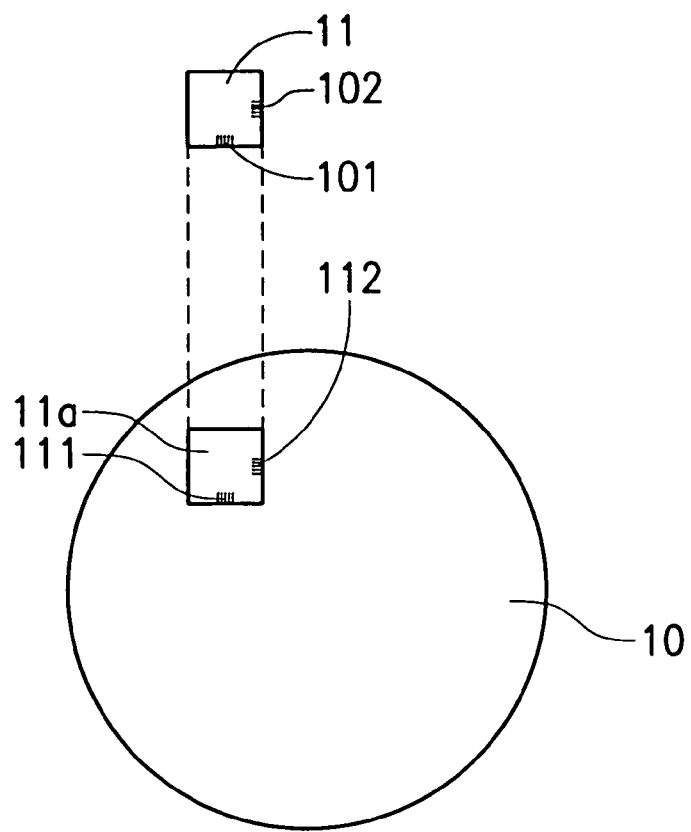
FIGS. 1a to 1i are cross-sections of a conventional method for multi-layer alignment.
Figure 1B:
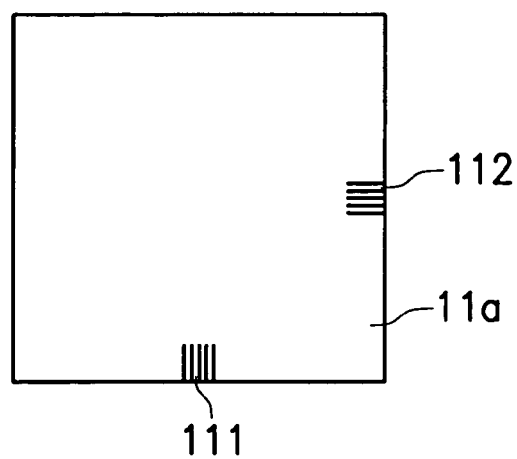
Figure 1C:
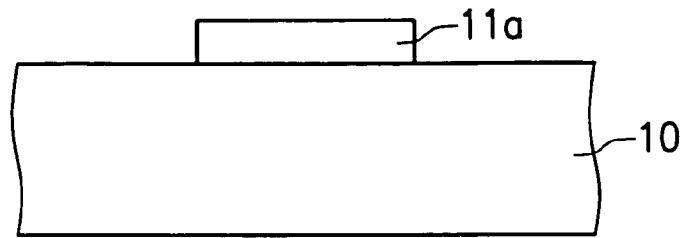
Figure 1D:
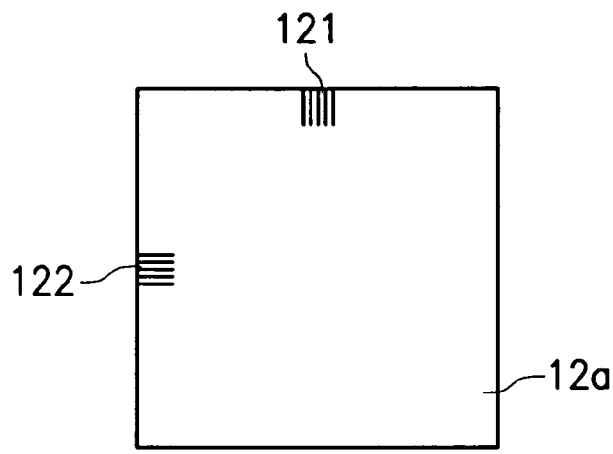
Figure 1E:
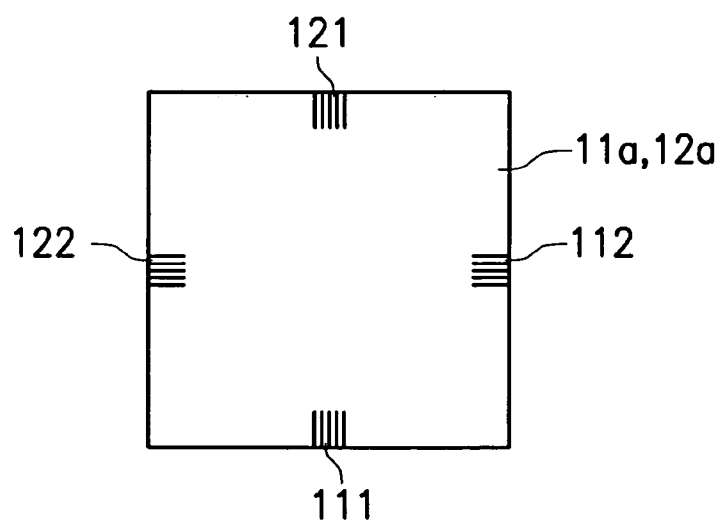
Figure 1F:
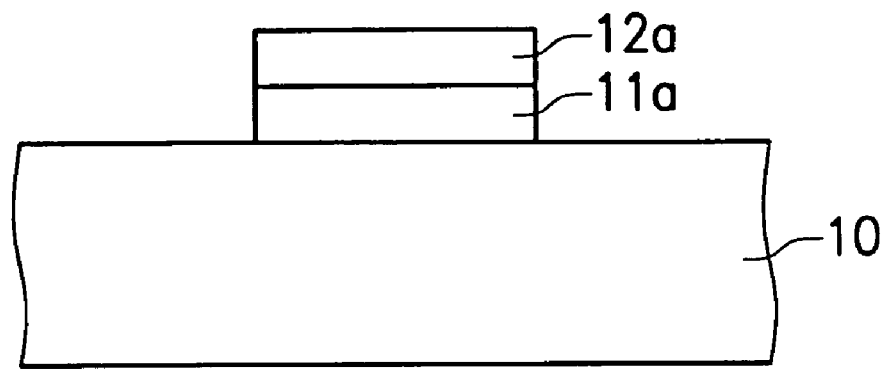
Figure 1G:
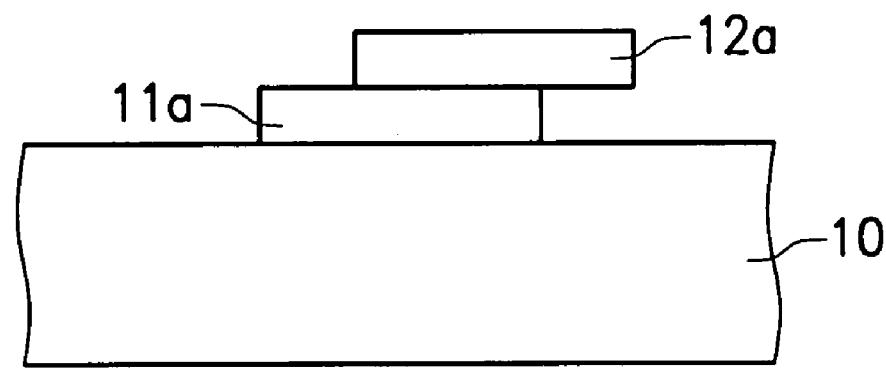
Figure 1H:
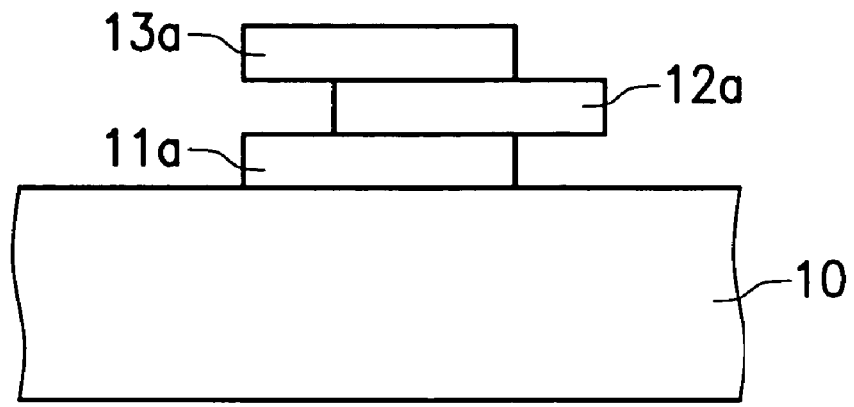
Figure 1I:
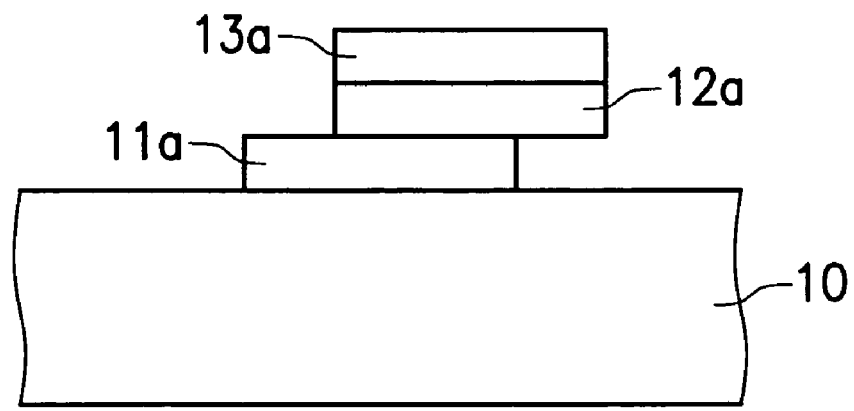

FIG. 3 is a flowchart of a method for multi-layer alignment of the present invention using the layers with marks shown in FIGS. 1a to 1c.

In step S301, a semiconductor substrate, such as a wafer, is provided. A first layer, such as metal wire layer, with at least two first marks is formed on the semiconductor substrate by photolithography. The first marks are on the X and Y axes respectively and separated parallelly by a predetermined distance.

In step S302, a second layer, such as metal wire layer, with at least two second marks is formed on the semiconductor substrate by photolithography. The second marks are on the X and Y axes respectively and separated parallelly by a predetermined distance.

In step S303, a first midpoint and a second midpoint of each first mark and each second mark on a semiconductor substrate deformed by oxidation or thermal process are measured respectively.

In step S304, midpoints of the deformed marks on the X and Y axes are measured respectively. Four marks are formed on the first layer and the second layer respectively, such that measurement of the midpoint is performed at least four times for each layer. Determination and calculation of the method in FIG. 3 is performed twice as many times as in FIG. 4.

In step S305, midpoints between each first midpoint and each second midpoint on the X and Y axes are calculated.

In step S306, the four midpoints between the first midpoints and the second midpoints are defined as datum points.

In step S307, a third layer is formed on the second layer by alignment with the datum points, such that the third layer aligns both the first layer and the second layer.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for multi-layer alignment of a semiconductor substrate with alignment marks, comprising:
   forming a first layer with first alignment marks on the semiconductor substrate, wherein the first alignment marks are separated parallelly by a predetermined distance;
   forming a second layer with second alignment marks on the first layer, wherein the second alignment marks are separated parallelly by a predetermined distance;
   measuring the shift distance of each first alignment mark caused by substrate deformation to calculate a first midpoint between the first alignments;
   measuring the shift distance of each second alignment mark caused by substrate deformation to calculate a second midpoint between the second alignments; and
   calculating a third midpoint acting as a datum point between the first midpoint and the second midpoint.

2. The method for multi-layer alignment as claimed in claim 1, wherein the second alignment marks and the first alignment marks overlap partially.

3. A method for multi-layer alignment for a semiconductor substrate with alignment marks, comprising:
   forming a first layer with first alignment marks on the semiconductor substrate, wherein the first alignment marks are separated parallelly by a predetermined distance;
   forming a second layer with second alignment marks on the first layer, wherein the second alignment marks are separated parallelly by a predetermined distance, and the second alignment marks and the first alignment marks are alternately disposed;
   measuring the shift distance of each first alignment mark caused by substrate deformation to calculate a first midpoint between the first alignments;
   measuring the shift distance of each second alignment mark caused by substrate deformation to calculate a second midpoint between the second alignments; and
   calculating a third midpoint acting as a datum point between the fist midpoint and the second midpoint.

4. The method for multi-layer alignment as claimed in claim 3, wherein the second alignment marks and the first alignment marks overlap partially.

* * * * *